(12) United States Patent
Telgmann

(10) Patent No.: US 8,823,469 B2
(45) Date of Patent: Sep. 2, 2014

(54) SAW FILTER AND A RECEIVER FOR REMOTE KEYLESS ENTRY AND TIRE PRESSURE MONITORING SYSTEMS USING SAME

(75) Inventor: Thomas Telgmann, Munich (DE)

(73) Assignee: Epcos AG, Munich (DE)

(*) Notice: Subject to any disclaimer, the term of this patent is extended or adjusted under 35 U.S.C. 154(b) by 470 days.

(21) Appl. No.: 13/201,425

(22) PCT Filed: Feb. 17, 2010

(86) PCT No.: PCT/EP2010/051989
§ 371 (c)(1),
(2), (4) Date: Sep. 20, 2011

(87) PCT Pub. No.: WO2010/094707
PCT Pub. Date: Aug. 26, 2010

(65) Prior Publication Data
US 2012/0001727 A1  Jan. 5, 2012

(30) Foreign Application Priority Data
Feb. 19, 2009 (DE) .......................... 10 2009 009 484

(51) Int. Cl.
*H03H 9/64* (2006.01)
*G08C 17/02* (2006.01)
*H04B 1/16* (2006.01)
*H03H 9/02* (2006.01)
*B60C 23/04* (2006.01)
*B60R 25/24* (2013.01)
*G07C 9/00* (2006.01)

(52) U.S. Cl.
CPC ............. *H03H 9/6476* (2013.01); *H03H 9/644* (2013.01); *H03H 9/02551* (2013.01); *B60C 23/0418* (2013.01); *G08C 17/02* (2013.01); *B60R 25/24* (2013.01); *G07C 2009/00261* (2013.01); *G07C 2009/00769* (2013.01)
USPC ......... 333/195; 333/193; 340/5.64; 340/5.72; 340/426.33; 340/426.36; 340/442

(58) Field of Classification Search
CPC ... H03H 9/02551; H03H 9/64; H03H 9/6426; H03H 9/643; H03H 9/6433; H03H 9/644; H03H 9/6456; H03H 9/6469; H03H 9/6476; H01Q 1/3241; G07C 2009/00174; G07C 2009/00261; G07C 2009/00769; G08C 17/02; B60C 23/0418; B60R 25/24
USPC .......... 333/133, 193–196; 310/313 B, 313 D; 340/5, 64, 72, 426.33, 426.36, 442
See application file for complete search history.

(56) References Cited

U.S. PATENT DOCUMENTS

| | | | | |
|---|---|---|---|---|
| 5,475,348 A | * | 12/1995 | Hode et al. ..................... | 333/195 |
| 5,559,483 A | * | 9/1996 | Kajihara et al. ............... | 333/195 |
| 5,666,092 A | * | 9/1997 | Yamamoto et al. ........... | 333/194 |

(Continued)

FOREIGN PATENT DOCUMENTS

| | | |
|---|---|---|
| DE | 197 26 594 A1 | 1/1999 |
| DE | 198 18 038 A1 | 11/2004 |

(Continued)

*Primary Examiner* — Barbara Summons
(74) *Attorney, Agent, or Firm* — Slater & Matsil, L.L.P.

(57) ABSTRACT

A SAW filter includes at least four electrically interconnected DMS tracks. First and second tracks of the at least four DMS tracks are connected in parallel in opposite directions to form a first filter element. The first and second tracks have two resonant frequencies that are offset from one another from track to track within the first filter element such that they define a common passband by virtue of a lower-frequency resonance of the first track being in phase at the same frequency as a higher-frequency resonance of the second track. Third and fourth tracks of the at least four DMS tracks can be connected in a similar fashion to form a second filter element. The passbands of the first and second filter elements are offset from one another and each comprise one of two channels of a two-channel filter.

20 Claims, 3 Drawing Sheets

(56) References Cited

U.S. PATENT DOCUMENTS

| | | | |
|---|---|---|---|
| 5,909,158 A * | 6/1999 | Hiramoto | 333/195 |
| 6,163,236 A | 12/2000 | Thomas | |
| 2004/0075511 A1 | 4/2004 | Inoue et al. | |
| 2004/0233021 A1 * | 11/2004 | Watanabe | 333/195 |
| 2010/0045397 A1 | 2/2010 | Kloska et al. | |

FOREIGN PATENT DOCUMENTS

| | | |
|---|---|---|
| DE | 10 2007 010 040 A1 | 9/2008 |
| EP | 0 545 672 A1 | 6/1993 |
| EP | 198 18 038 A1 | 11/1999 |
| JP | 07-297669 A | 11/1995 |
| JP | 8-204502 A | 8/1996 |
| JP | 09-116381 A | 5/1997 |
| JP | 10-093387 A | 4/1998 |
| JP | 10-209808 * | 8/1998 |
| JP | 2001-500698 A | 1/2001 |
| JP | 2001-177370 A | 6/2001 |
| JP | 2001-352228 A | 12/2001 |
| JP | 2004-343637 A | 12/2004 |
| JP | 2006-148372 A | 6/2006 |
| WO | WO 98/12807 A1 | 3/1998 |

* cited by examiner

SAW FILTER AND A RECEIVER FOR REMOTE KEYLESS ENTRY AND TIRE PRESSURE MONITORING SYSTEMS USING SAME

This patent application is a national phase filing under section 371 of PCT/EP2010/051989, filed Feb. 17, 2010, which claims the priority of German patent application 10 2009 009 484.9, filed Feb. 19, 2009, each of which is incorporated herein by reference in its entirety.

BACKGROUND

Transmission systems with lower output power and range operate on different frequency bands worldwide. In Europe, this is the ISM (Industrial Science Medical) band around 433.92 MHz and the short range device (SRD) band between 869 MHz and 870 MHz, for example. By contrast, in the USA, use is frequently made of the ISM band and the very wide band around 915 MHz. There are further bands around 315 MHz and around 390 MHz, inter alia.

Many applications, such as telemetry, for example for tire pressure measurement systems (TPMS) or remote keyless entry (RKE), can be operated license-free in the bands therein. However, some manufacturers of corresponding appliances often use only narrowband frequency ranges which are used exclusively for the respective applications.

For such narrow frequency ranges, it is possible to use receivers with narrow band filters, for example on the basis of quartz filters. If a plurality of such applications using closely adjacent but different channels for these frequency bands are now used in a motor vehicle, for example, each of these applications sometimes requires a dedicated reception filter which is in turn of correspondingly narrowband design for the respective channel. In order to separate the channels, it is then possible to use switches.

If the aim is to dispense with the switches in a receiver, however, a front end filter whose passband covers all the desired channels is required. On account of the bandwidth of the individual channels and also tolerances which need to be taken into account, a reception filter would then be required whose bandwidth cannot be implemented using a quartz filter, or can be implemented only with worsening properties. As the bandwidth increases, the impedance of quartz-based SAW (Surface Acoustic Wave) filters rises, and the matching stability also suffers at higher impedances.

SUMMARY OF THE INVENTION

In one aspect, the present invention specifies a filter which can be used to receive at least two closely adjacent narrowband channels and which has a high level of stop band rejection.

The invention specifies a novel kind of filter concept and provides not a wide band filter but rather a filter having two separately optimized passbands for the desired frequency range. The two passbands are distinguished by low insertion loss and furthermore have steep edges toward the stop band. Between the two passbands, that is to say for frequencies which are not associated with either of the two channels, stop band attenuation is also achieved which attains higher values as the interval between the two channels increases.

A two-channel filter of this kind is successfully implemented by electrically connecting four DMS (Dual Mode Surface acoustic wave) tracks. Two respective instances of the DMS tracks are connected in parallel with a filter element in opposite directions. In this case, each of said filter elements uses an inherently known design for widening passbands for DMS filters on substrates with low coupling. The two DMS tracks of each filter element have two respective principal resonances which are shifted relative to one another from track to track such that the upper principal resonance of the first track overlaps the lower principal resonance of the second track. The parallel connection of the two tracks in opposite directions prompts direct-phase overlay for signals in the region of the common principal resonance.

An inherently known filter element of this kind can now be extended to a certain bandwidth but fails thereafter because it would otherwise produce an excessive impedance and the rejection in the stop band would become too poor. Simple interconnection of two such filter elements will normally also not result in satisfactory electrical performance, since each track has not only the two principal resonances but also a multiplicity of further modes which are each situated below the respective principal resonances. Normally, these modes are not disruptive for a filter element compiled from two tracks, since they are in the filter stop band and merely reduce the short-range rejection of the filter. If the resonant frequencies of the two filter elements are now separated to such an extent that the desired band coverage or a greater filter bandwidth is achieved, however, these auxiliary modes of a filter element may be situated in the passband of the other filter element and result in dips in the passband at that point and hence in a high level of insertion loss and a rippled passband. Both are unsatisfactory.

The invention now avoids this by virtue of the interval between the auxiliary modes and the principal modes being set in each of the two filter elements such that for a given offset between the passbands the auxiliary modes are each arranged in phase with a principal resonance of the respective other filter element. This produces a filter which has two passbands with low insertion loss and a smooth passband following matching. Ordinarily disruptive auxiliary modes for a filter element are now situated in the respective adjacent passband and, since they are overlaid in the correct phase, no longer result in any distortion of the transmission at that point.

For the filter according to the invention, it is possible to use any DMS tracks provided that they have the two principal resonances which are typical of DMS filters. The four interconnected DMS tracks may be formed on a common substrate with a low coupling constant and particularly on quartz. The low coupling constant guarantees steep edges for the passbands.

A filter according to the invention may have pass bandwidths which are in the same order of magnitude as the band gap between the two passbands. For passbands that are closer together, the achievable bandwidth of each filter element is reduced, whereas for passbands which are further apart, the insertion loss is impaired again. The filter can therefore be used particularly for two narrowband channels which share the same frequency band and are at approximately the cited interval from one another which corresponds to the pass bandwidth.

Each DMS track has at least two interdigital transducers which are arranged between two reflectors. At least one respective interdigital transducer is connected to the input and at least one further transducer is connected to the output of the filter. Contingent on the interval between the interdigital transducer(s) and the reflectors and the interval between the interdigital transducers themselves, each DMS track has at least two resonance spaces formed in it in which a respective standing wave is formed and can thus produce the respective resonance of the DMS track.

However, auxiliary resonances are also produced in each DMS track, these being attributable to auxiliary modes which are capable of oscillation and propagation in the resonance space. In accordance with the invention, influencing of the auxiliary modes and particularly influencing of the interval between principal and auxiliary modes are successfully achieved by means of a suitable choice of the number of electrode fingers per interdigital transducer and corresponding adjustment of the interval between the interdigital transducer and the reflectors and/or the interval between the interdigital transducers themselves. Only by varying these parameters are the auxiliary modes of a filter element successfully shifted to the frequencies of a principal resonance of the adjacent filter element exactly. The remaining design parameters of each DMS track are unaffected thereby and can be optimized independently.

In principle, it is possible for the two DMS tracks of each filter element to be of similar design and to have only a correspondingly different electrode finger interval or a different finger period in order to attain the desired frequency offset between the two DMS tracks. This can be done solely by scaling a DMS track, for example. However, it is also possible for specific optimization requirements to mean that the two DMS tracks of a filter element differ from one another to a greater extent.

The same applies to the two filter elements, which may be of the same design, of similar design or of different design. In any case, it is possible, in principle, for the two-channel filter according to the invention to be produced with four approximately identical but frequency-offset DMS tracks.

The differences between the individual DMS tracks may be particularly the number of electrode fingers in the interdigital transducers, the intervals between the transducers and the reflectors and particularly the number of interdigital transducers. The remaining parameters are preferably constant over all the DMS tracks, since they are optimized for other important properties of the filter and do not need to be varied in order to set the desired resonance intervals for auxiliary and principal modes. Such properties which remain constant over the entire filter are particularly the metallization level and the metallization ratio.

In one embodiment of the invention, a DMS track has two interdigital transducers arranged between two reflectors. A further, at least partially transparent acoustic reflector is arranged between the two interdigital transducers. The number of reflector strips in the partially transparent reflector can be used to set further filter properties and particularly the coupling of the two interdigital transducers or their associated resonance spaces.

A filter according to the invention can be used to equip a receiver, for example, which, when used in an automobile, can serve two radio channels which are used for different wireless applications or systems. Thus, for example, the center frequency of an RKE system is 315 MHz, whereas the frequency of a radio-pollable TPMS is 313.85 MHz. In a filter according to the invention, the passbands can now be optimized for these two center frequencies. Relative channel widths between 0.03 and 0.1% are sufficient for the applications. On account of production and temperature tolerances which need to be taken into account, however, the relative width of the filter elements may also be between 0.03 and 0.25%. It is preferred if the relative width is between 0.1 and 0.25%.

In order to implement a two-channel filter according to the invention, four acoustic tracks with a respective DMS track are sufficient. However, it is also possible to reduce the filter impedance by also identically duplicating or triplicating each of the tracks or each of the filter elements, so that the filter then contains a total of four, eight or twelve interconnected DMS tracks.

Between the total of three principal resonances, which define the passband of each filter element, the response of the filter can be optimized by means of appropriate matching and connection to matching elements or to a matching network, such that each filter element has a smooth passband without spurious dips.

BRIEF DESCRIPTION OF THE DRAWINGS

The invention is explained in more detail below with reference to exemplary embodiments and the associated figures. The figures are shown merely schematically and not to scale. To improve understanding, individual dimensions may have been shown in distorted fashion, which means that relative indications of measurements cannot be taken from the figures either.

DETAILED DESCRIPTION OF ILLUSTRATIVE EMBODIMENTS

Figure 1:
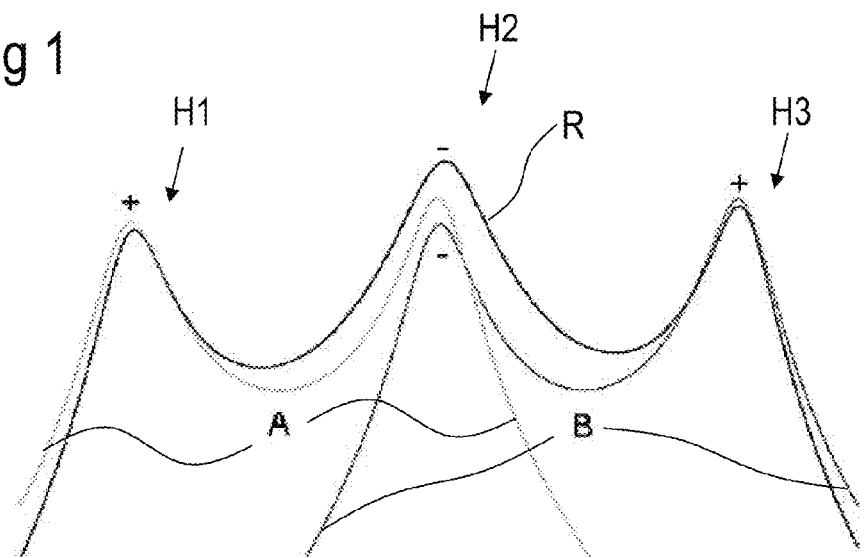
FIG. 1 shows the transfer curves for the two DMS tracks of an inherently known twin DMS filter.

FIG. 1 is used to explain the inherently known principle of the twin DMS filter. The schematic illustration uses the transfer curves A and B from two DMS tracks to show how the two respective principal resonances of the two DMS tracks can be combined to form the twin DMS filter with the resulting transfer curve R. Each of the two transfer curves A, B has two resonances which are in different phases +, −. The frequencies of the two transfer curves A, B are shifted relative to one another such that the upper resonance of the transfer curve A comes to rest at approximately the same frequency as the lower resonance of the transfer curve B for the second DMS track and both individual resonances together form the mean principal resonance H2 of the filter element. The other principal resonances H1 and H3 follow below and above the principal resonance H2. Together, they form the passband for the twin DMS filter.

In this case, it is possible to obtain the second DMS track by scaling the first DMS track, so that the relevant frequency shift is achieved. The transfer curves to be associated with the two filter elements can be added in phase if the DMS tracks A, B, which can be converted into one another by means of scaling, for example, are connected in parallel in opposite directions. However, it is also possible for the two DMS tracks to be connected in parallel and for the phase of one of the tracks to be inverted as appropriate by folding the relevant interdigital transducers around the longitudinal axis of the filter. A change in the phase can also be obtained if one of the two interdigital transducers is shifted by a half wavelength relative to the other interdigital transducer.

Figure 2:
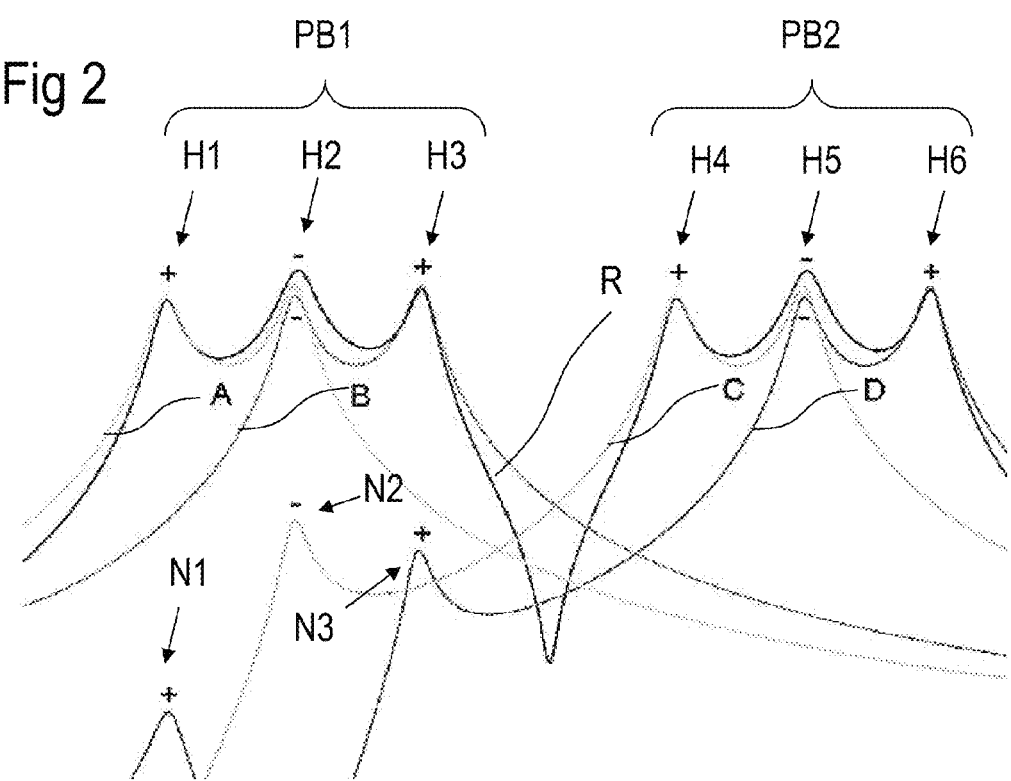
FIG. 2 shows the transfer curves for the four DMS tracks of a filter according to the invention.

FIG. 2 shows the transfer curve R for a filter according to the invention and how the latter is obtained from the transfer curves A, B, C and D of four DMS tracks connected according to the invention. A first filter element with the passband PB1 is compiled from two DMS tracks with the transfer curves A, B in accordance with the illustration shown in FIG. 1. This filter element has the principal maxima H1, H2 and H3, which can be attributed to the individual resonances of the DMS tracks A, B. + and − respectively indicate the alternating phase of said maxima.

A second filter element with the passband PB2 is compiled in the same way from two further DMS tracks with the transfer curves C and D. This filter element also has three principal resonances H4, H5 and H6 with alternating phase. The three principal resonances H4, H5 and H6 together define the passband for this filter element.

The passbands from the first and second filter elements are offset from one another in terms of frequency. The transfer curves of the individual DMS filters reveal that one or more auxiliary resonances N1, N2 and N3 also arise in each case below the respective passband of a filter element. In accordance with the invention, this filter now involves the use of suitable variation of the number of fingers, of the intervals between the interdigital transducers and the reflectors and of the intervals between the interdigital transducers themselves to set a frequency interval between principal and auxiliary modes which is such that all auxiliary modes of a filter element occur in phase and at the same frequency as the principal modes of the other filter element. As a result, the constructive overlay of principal and auxiliary resonances reduces distortion in the passband of the lower filter element. R denotes the resultant overall transfer curve for the filter according to the invention, which in this case is compiled from four DMS tracks.

Figure 3:
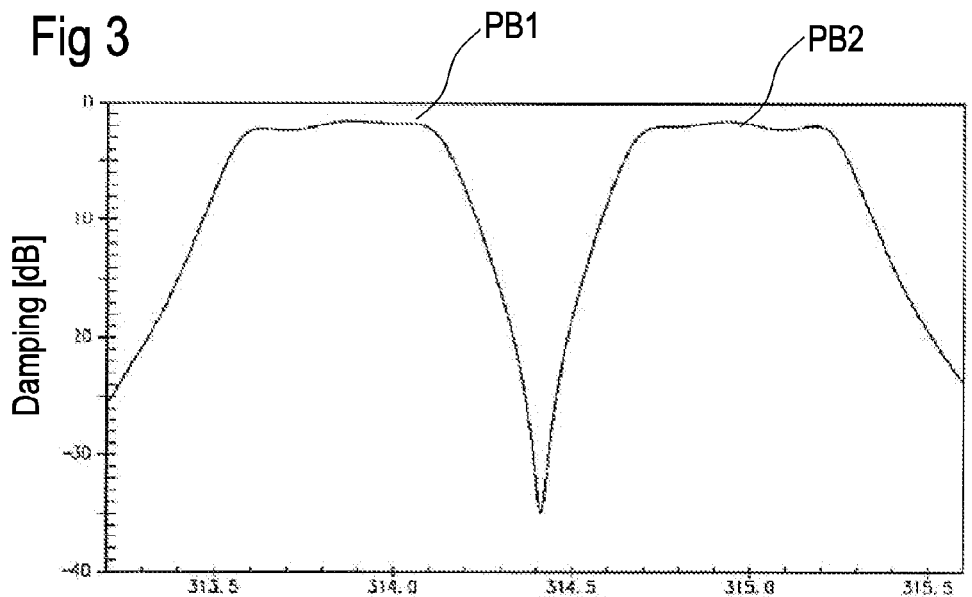
FIG. 3 shows the transfer curves for a filter according to the invention when they have been smoothed by means of matching.

This unmatched and—in the region of the passbands—still rippled transfer function can be smoothed by connection to appropriate matching elements. FIG. 3 shows a filter according to the invention, the transfer function of which has been smoothed using matching elements. In the region of the passbands, only a small amount of ripple can be observed. Between the two passbands PB1 and PB2, there is a dip in the transfer curve; as a result, a desired level of stop band rejection appears in this frequency range. Toward the stop band below the first passband PB1 and above the second passband PB2, there is sufficient attenuation with steeply falling passband edges.

Figure 4:
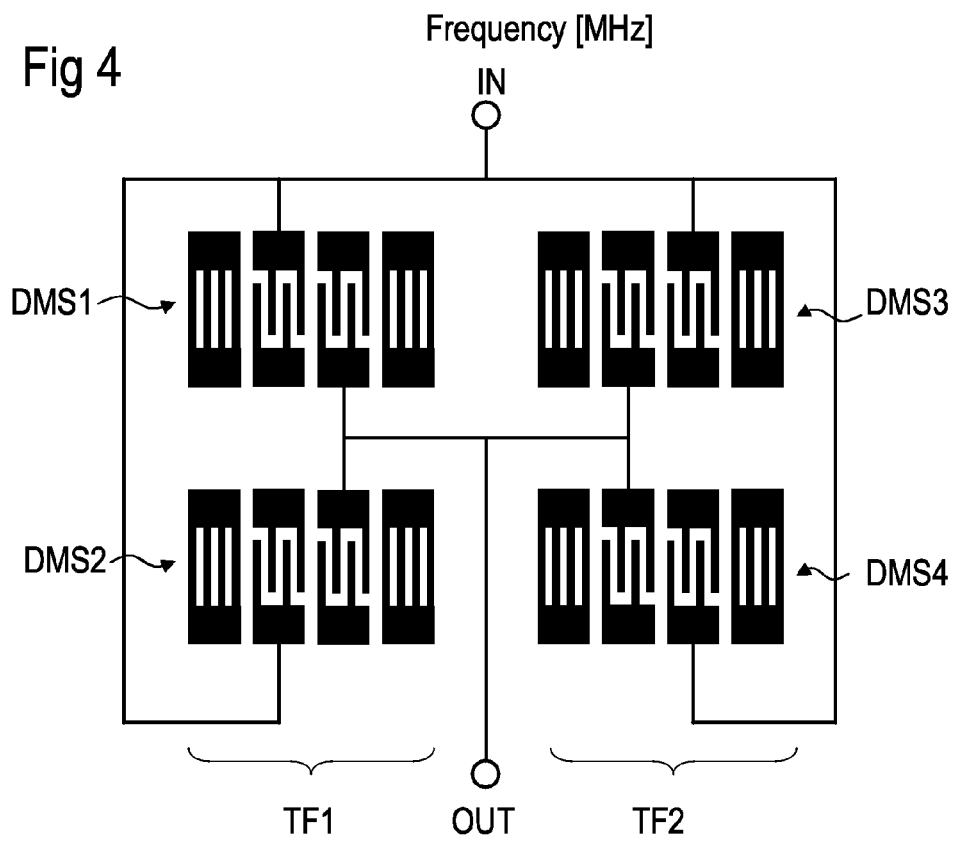
FIG. 4 shows a schematic diagram of a filter according to the invention.

FIG. 4 uses schematically illustrated DMS tracks to show possible connection to a filter according to the invention with two passbands for two adjacent channels. Each of the DMS tracks DMS 1 to DMS4 has two interdigital transducers which are arranged between two reflectors. The reflectors have reflector strips which are situated at a grid spacing of a half wavelength and which can be shorted together in the reflector by means of appropriate bus bars. It is also possible to connect the reflectors to ground.

For the sake of simplicity, the figure shows all four DMS tracks, DMS1 to DMS4, with the same design and the same orientation. In actual fact, the individual DMS tracks generally differ in terms of the number of fingers, however, which is necessary particularly for the purpose of shifting the auxiliary resonances in accordance with the invention, as shown in FIG. 2. Similarly, the intervals between two interdigital transducers on a DMS track or between an interdigital transducer and an adjacent reflector are set such that the two cited principal resonances are maintained and at the same time the auxiliary resonances are arranged at a suitable interval from the principal resonances. In the embodiment shown in FIG. 4, the first and second DMS tracks, DMS1 and DMS2, are connected in parallel in opposite directions between an input IN and output OUT to form a first filter element TF1. The shift in the resonant frequencies of the two DMS tracks and the parallel connection in opposite directions produce a constructive—because it has the correct phase—overlay for all the frequency components from both filters.

The second filter element TF2, which comprises the DMS tracks, DMS3 and DMS4, connected in parallel in opposite directions, is connected in parallel with the first filter element TF1. In addition to this embodiment, correct-phase interconnection or, if necessary, desired inversion of the phase can naturally also be obtained by mirroring a transducer along the longitudinal axis of a DMS track. If each of the tracks from the second filter element is mirrored around the longitudinal axis, for example, then the first and second filter elements can be connected in parallel with one another in opposite directions, which ultimately results in the same phase with positive overlay.

In a further modification of the structure shown in FIG. 4, two or more such structures comprising two respective filter elements can be connected in parallel with one another, with the filter properties and particularly the impedance of the overall filter being able to be improved further.

Figure 5:
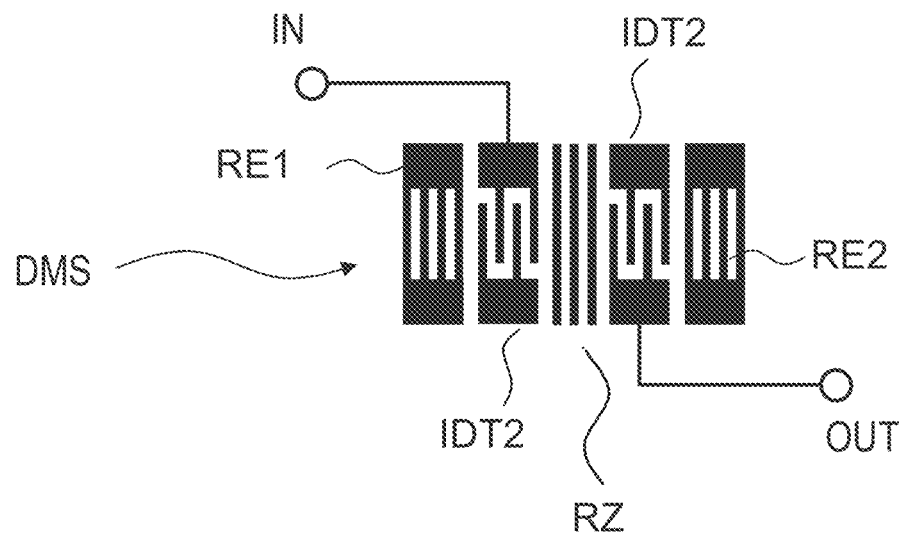
FIG. 5 shows a variation of a DMS track.

FIG. 5 shows a further modification of a DMS track, as can be used in the filter according to the invention. This DMS track also comprises two interdigital transducers IDT1 and IDT2 which are arranged between two reflectors RE1 and RE2 within an acoustic track. In contrast to the illustration in FIG. 4, however, the first interdigital transducer IDT1 and the second interdigital transducer IDT2 have an intermediate reflector RZ arranged between them. This has individual reflector strips or reflector strips connected to form a grating. The number of reflector strips in the intermediate reflector RZ is smaller than that in the outer reflectors RE1, RE2, however, which means that this intermediate reflector RZ is acoustically transparent. A bus bar on the first interdigital transducer IDT1 is connected to the input, and the opposite bus bar on the second interdigital transducer IDT2 is connected to the output. The other respective bus bars—in this case shown floating in the figure—are usually connected to ground, as are the reflectors and the intermediate reflectors. However, the reflectors and intermediate reflectors can also be used for making electrical contact with the interdigital transducers. In that case, they would be at an electrical potential. The same applies to the arrangement shown in FIG. 4.

All DMS tracks in a filter are preferably arranged on the same substrate and preferably on a quartz substrate. However, it is also possible to use other substrate materials, but less steeply falling filter edges must be accepted. On account of the relatively high level of coupling, all design parameters need to be matched accordingly for a SAW filter on a different substrate material such as lithium tantalate or lithium niobate.

The invention is not limited to the implementations illustrated in the exemplary embodiments and the associated figures. Further variation options are obtained particularly from the nature of the interconnection, the number of finger electrodes, the size of the intermediate reflector or even of the number of interdigital transducers per DMS track. Each DMS track can have more than two interdigital transducers which are each connected between the input and the output of the filter. Particularly for filters on quartz substrates, however, the embodiment with two interdigital transducers, preferably with an intermediate reflector, is entirely sufficient in order to obtain a smooth passband—as shown in FIG. 3—with good short-range attenuation.

The invention claimed is:
1. A SAW filter, comprising:
at least four electrically interconnected DMS tracks,
wherein first and second tracks of the at least four DMS tracks are connected in parallel in opposite directions to form a first filter element, wherein the first and second tracks have two resonant frequencies that are offset from one another from track to track within the first filter element such that they define a common passband by virtue of a lower-frequency resonance of the first track being in phase at the same frequency as a higher-frequency resonance of the second track, wherein third and fourth tracks of the at least four DMS tracks are connected in parallel in opposite directions to form a second filter element, wherein the third and fourth tracks have two resonant frequencies that are offset from one another from track to track within the second filter element such that they define a common passband by virtue of a lower-frequency resonance of the third track being in phase at the same frequency as a higher-frequency resonance of the fourth track, wherein the passbands of the first and second filter elements are offset from one another and each comprises one of two channels of a two-channel filter, wherein an interval between auxiliary modes and principal modes is set in the first and second filter elements such that for a given offset for the passbands the auxiliary modes of one of the filter elements are each arranged in phase with a principal resonance of the other of the filter elements.

2. The filter according to claim 1, wherein the first, second, third and fourth tracks are formed on a common substrate.

3. The filter according to claim 2, wherein the common substrate has a low coupling constant.

4. The filter according to claim 2, wherein the common substrate comprises a quartz substrate.

5. The filter according to claim 1, wherein a bandwidth of the passband of the first or second filter elements is in the same order of magnitude as a bandgap between the passbands of the first and second filter elements.

6. The filter according to claim 1, wherein the two channels are of narrowband design and share the same frequency band.

7. The filter according to claim 1, wherein each DMS track has an input and an output, and wherein, for each DMS track, the input is connected to an interdigital transducer and the output is connected to a different interdigital transducer.

8. The filter according to claim 7, wherein the interdigital transducer and the different interdigital transducer are arranged between two reflectors.

9. The filter according to claim 7, wherein at least one of the DMS tracks contains an acoustically transparent reflector between the interdigital transducer and the different interdigital transducer.

10. The filter according to claim 1, wherein a first channel of the two channels has a center frequency of 313.85 MHz and a second channel of the two channels has a center frequency of 315.0 MHz.

11. The filter according to claim 1, wherein a relative channel width of each of the two channels is between 0.1 and 0.25%.

12. The filter according to claim 1, wherein the filter is installed in a radio receiver for simultaneous reception in a remote keyless entry system and in a radio-pollable tire pressure monitoring system.

13. A system comprising:
a remote keyless entry system;
a radio-pollable tire pressure monitoring system; and
a radio receiver for simultaneous reception in the remote keyless entry system and in the radio-pollable tire pressure monitoring system, the radio receiver comprising a SAW filter that comprises at least four electrically interconnected DMS tracks;

wherein first and second tracks of the at least four DMS tracks are connected in parallel in opposite directions to form a first filter element;

wherein the first and second tracks have two resonant frequencies that are offset from one another from track to track within the first filter element such that they define a common passband by virtue of a lower-frequency resonance of the first track being in phase at the same frequency as a higher-frequency resonance of the second track;

wherein third and fourth tracks of the at least four DMS tracks are connected in parallel in opposite directions to form a second filter element;

wherein the third and fourth tracks have two resonant frequencies that are offset from one another from track to track within the second filter element such that they define a common passband by virtue of a lower-frequency resonance of the third track being in phase at the same frequency as a higher-frequency resonance of the fourth track;

wherein the passbands of the first and second filter elements are offset from one another and each comprise one of two channels of a two-channel filter; and wherein an interval between auxiliary modes and principal modes is set in the first and second filter elements such that for a given offset for the passbands the auxiliary modes of one of the filter elements are each arranged in phase with a principal resonance of the other of the filter elements.

14. The system according to claim 13, wherein the first, second, third and fourth tracks are formed on a common substrate.

15. The system according to claim 14, wherein the common substrate comprises a quartz substrate.

16. The system according to claim 13, wherein a bandwidth of the passband of the first or second filter elements is in the same order of magnitude as a bandgap between the passbands of the first and second filter elements.

17. The system according to claim 13, wherein the two channels are of narrowband design and share the same frequency band.

18. The system according to claim 13, wherein each DMS track has an input and an output, and wherein, for each DMS track, the input is connected to an interdigital transducer and the output is connected to a different interdigital transducer.

19. The system according to claim 13, wherein a first channel of the two channels has a center frequency of 313.85 MHz and a second channel of the two channels has a center frequency of 315.0 MHz.

20. The system according to claim 13, wherein a relative channel width of each of the two channels is between 0.1 and 0.25%.

* * * * *